United States Patent
Braendle et al.

(10) Patent No.: US 6,274,249 B1
(45) Date of Patent: Aug. 14, 2001

(54) TOOL WITH TOOL BODY AND PROTECTIVE LAYER SYSTEM

(75) Inventors: Hans Braendle, Sargans (CH); Nobuhiko Shima, Narita (JP)

(73) Assignee: Unaxis Balzers Aktiengesellschaft, Fuerstentum (LI)

( * ) Notice: Subject to any disclaimer, the term of this patent is extended or adjusted under 35 U.S.C. 154(b) by 0 days.

(21) Appl. No.: 08/928,668

(22) Filed: Sep. 12, 1997

(51) Int. Cl.$^7$ ........................................................ B22F 3/00
(52) U.S. Cl. .................. 428/551; 428/553; 428/699; 204/192.38
(58) Field of Search ............... 204/192.12, 192.32, 204/192.34, 192.38, 298.23, 298.26, 298.28, 298.31, 298.35, 298.36, 298.41; 118/723 HC, 723 VE; 428/697, 698, 699, 704, 553, 551

(56) References Cited

U.S. PATENT DOCUMENTS

| | | | |
|---|---|---|---|
| 4,448,802 | * | 5/1984 | Buhl et al. ...................... 204/298.41 |
| 4,529,475 | * | 7/1985 | Okano et al. ................... 204/298.36 |
| 4,574,179 | * | 3/1986 | Masuzawa et al. .............. 204/298.36 |
| 4,877,505 | * | 10/1989 | Bergmann ...................... 204/298.41 |
| 4,885,068 | * | 12/1989 | Uramoto et al. ................ 204/298.41 |
| 5,234,561 | * | 8/1993 | Randhawa et al. ............. 204/298.41 |
| 5,318,840 | * | 6/1994 | Ikeda et al. ........................ 428/698 |
| 5,549,975 | * | 8/1996 | Schulz et al. ....................... 428/553 |
| 5,709,784 | * | 1/1998 | Braendle et al. ............... 204/192.38 |
| 5,753,045 | * | 5/1998 | Karner et al. ................. 118/723 HC |

FOREIGN PATENT DOCUMENTS

| | | |
|---|---|---|
| 0 591 122 A1 | 4/1994 | (EP) . |
| 0 701 982 A1 | 3/1996 | (EP) . |
| 405179310A | * 7/1993 | (JP) . |
| 8-209335 | 8/1996 | (JP) . |

OTHER PUBLICATIONS

Average Energy Deposited Per Atom: A Universal Parameter For Describing Ion–Assisted Film Growth; Petrov et al.; Applied Physics Letters, Jul. 5, 1993, pp. 36–38.

The Structure And Composition Of Ti–Zr–N, Ti–Al–Zr–N and Ti–Al–V–N Coatings, Knotek et al.; Materials Science and Engineering, Dec. 1988; pp. 481–488.

Interrelationship Between Processing, Coating Properties And Functional Properties of Steered ARC Physically Vapour Deposited (Ti,Al) N And (Ti,Nb) N Coatings; Roos et al.; Elsevier Sequoia; Dec. 1, 1990; pp. 547–556.

Effects of R.F. Bias And Nitrogen Flow Rates On The Reactive Sputtering Of TiAlN Films; Shew et al.; Elsevier; Dec. 1997; pp. 212–219.

Effects of High–Flux Low–Energy (20–100 eV) Ion Irradiation During Deposition On The Microstructure And Preferred Orientation of $Tl_{0.5}Al_{0.5}N$ Alloys Grown By Ultra–High–Vacuum Reactive Magnetron Sputtering; Adibi et al.; Journal of Applied Physics, Jun. 15, 1993; pp. 8580–8589.

\* cited by examiner

Primary Examiner—Scott Kastler
(74) Attorney, Agent, or Firm—Evenson, McKeown, Edwards & Lenahan, P.L.L.C.

(57) ABSTRACT

There is proposed a tool with a tool body and a wear resistant layer system, which layer system comprises at least one layer of MeX. Me comprises titanium and aluminum and X is nitrogen or carbon. The tool is a solid carbide end mill, a solid carbide ball nose mill or a cemented carbide gear cutting tool. Thereby, in the MeX layer the quotient $Q_I$ as defined by the ratio of the diffraction intensity I(200) to I(111) assigned respectively to the (200) and (111) plains in the X ray diffraction of the material using the $\theta$–$2\theta$ method is selected to be $\leq 2$. Further, the I(111) is at least twenty times larger than the intensity average noise value, both measured with a well-defined equipment and setting thereof.

18 Claims, 4 Drawing Sheets

TOOL WITH TOOL BODY AND PROTECTIVE LAYER SYSTEM

BACKGROUND OF THE INVENTION

This description incorporates U.S. Pat. No. 5,709,784 by reference herein.

The present invention is directed on a tool with a tool body and a protective layer system, wherein the layer system comprises at least one layer of MeX, wherein Me comprises titanium and aluminum, X is at least one of nitrogen and of carbon.

Definition

The term $Q_I$ is defined as the ratio of the diffraction intensities I(200) to I(111), assigned respectively to the (200) and (111) plains in the X ray diffraction of a material using the θ–2θ method. Thus, there is valid $Q_I=I(200)/I(111)$. The intensity values were measured with the following equipment and with the following settings:

Siemens Diffractometer D500

Power:
  Operating voltage: 30 kV
  Operating current: 25 mA
Aperture Diaphragms:
  Diaphragm position I: 1°
  Diaphragm position II: 0.1°
Detector Diaphragm: Soller slit
Time constant: 4 s
2θ angular speed: 0.05°/min
Radiation: Cu—Kα(0.15406 nm)

When we refer to "measured according to MS" we refer to this equipment and to these settings. Thereby, all quantitative results for $Q_I$ and I throughout this application have been measured by MS.

We understand by "tool body" the uncoated tool.

We understand under "hard material" a material with which tools which are mechanically and thermally highly loaded in operation are coated for wear resistance. Preferred examples of such materials are referred to below as MeX materials.

It is well-known in the tool-protecting art to provide wear resistant layer systems which comprise at least one layer of a hard material, as defined by MeX.

SUMMARY OF THE INVENTION

The present invention has the object of significantly improving the lifetime of such tools. This is resolved by selecting for said at least one layer a $Q_I$ value, for which there is valid $$Q_I \leq 2$$

and wherein the tool is a solid carbide end mill or a solid carbide ball nose mill or a cemented carbide gear cutting tool. Further, the value of I(111) is higher by a factor of at least 20 than the intensity noise average level as measured according to MS.

According to the present invention it has been recognised that the $Q_I$ values as specified lead to an astonishingly high improvement of wear resistance, and thus of lifetime of a tool, if such a tool is of the kind as specified.

Up to now, application of a wear resistant layer system of MeX hard material was done irrespective of interaction between tool body material and the mechanical and thermal load the tool is subjected to in operation. The present invention thus resides on the fact that it has been recognised that an astonishing improvement of wear resistance is realised when selectively combining the specified $Q_I$ value with the specified kind of tools, thereby realising a value of I(111) higher by a factor of at least 20 then the average noise intensity level, both measured with MS.

The inventively reached improvement is even increased if $Q_I$ is selected to be at most 1, and an even further improvement is realised by selecting $Q_I$ to be at most 0.5 or even to be at most 0.2. The largest improvements are reached if $Q_I$ is at most 0.1. It must be stated that $Q_I$ may drop towards zero, if the layer material is realised with a unique crystal orientation according to a vanishing diffraction intensity I(200). Therefore, there is not set any lower limit for $Q_I$ which is only set by practicability.

As is known to the skilled artisan there exists a correlation between hardness of a layer and stress therein. The higher the stress, the higher the hardness. Nevertheless, with rising stress, the adhesion to the tool body tends to diminish.

For the tool according to the present invention a high hardness is rather more important than the best possible adhesion. Therefore, the stress in the MeX layer is advantageously selected rather at the upper end of the stress range given below. These considerations limit in practice the $Q_I$ value exploitable.

In a preferred embodiment of the inventive tool, the MeX material of the tool is titanium aluminum nitride, titanium aluminum carbonitride or titanium aluminum boron nitride, whereby the two materials first mentioned are today preferred over titanium aluminum boron nitride.

In a further form of realisation of the inventive tool, Me of the layer material MeX may additionally comprise at least one of the elements boron, zirconium, hafnium, yttrium, silicon, tungsten, chromium, whereby, out of this group, it is preferred to use yttrium and/or silicon and/or boron. Such additional element to titanium and aluminum is introduced in the layer material, preferably with a content i, for which there is valid $$0.05 \text{ at. } \% \leq i \leq 60 \text{ at. } \%,$$

taken Me as 100 at %.

A still further improvement in all different embodiments of the at least one MeX layer is reached by introducing an additional layer of titanium nitride between the MeX layer and the tool body with a thickness d, for which there is valid $$0.05 \text{ } \mu m \leq d \leq 5 \text{ } \mu m.$$

In view of the general object of the present invention, which is to propose the inventive tool to be manufacturable at lowest possible costs and thus most economically, there is further proposed that the tool has only one MeX material layer and the additional layer which is deposited between the MeX layer and the tool body.

Further, the stress σ in the MeX is preferably selected to be $$2 \text{ GPa} \leq \sigma \leq 8 \text{ GPa},$$

thereby most preferably with the range $$4 \text{ GPa} \leq \sigma \leq 6 \text{ GPa}.$$

The content x of titanium in the Me component of the MeX layer is preferably selected to be $$70 \text{ at } \% \geq x \geq 40 \text{ at } \%,$$

thereby in a further preferred embodiment within the range 65 at % ≥ x ≥ 55 at %.

On the other hand, the content y of aluminum in the Me component of the MeX material is preferably selected to be 30 at % ≤ y ≤ 60 at %, in a further preferred embodiment even to be 35 at % ≤ y ≤ 45 at %.

In a still further preferred embodiment, both these ranges, i.e. with respect to titanium and with respect to aluminum are fulfilled.

The deposition, especially of the MeX layer, may be done by any known vacuum deposition technique, especially by a reactive PVD coating technique, as e.g. reactive cathodic arc evaporation or reactive sputtering. By appropriately controlling the process parameters, which influence the growth of the coating, the inventively exploited $Q_I$ range is realised.

To achieve excellent and reproducible adhesion of the layers to the tool body a plasma etching technology was used, as a preparatory step, based on an Argon plasma as described in U.S. Pat. No. 5,709,784, which document is integrated to this description by reference, with respect to such etching and subsequent coating.

DESCRIPTION OF THE PREFERRED EMBODIMENT

EXAMPLE 1

Figure 1:
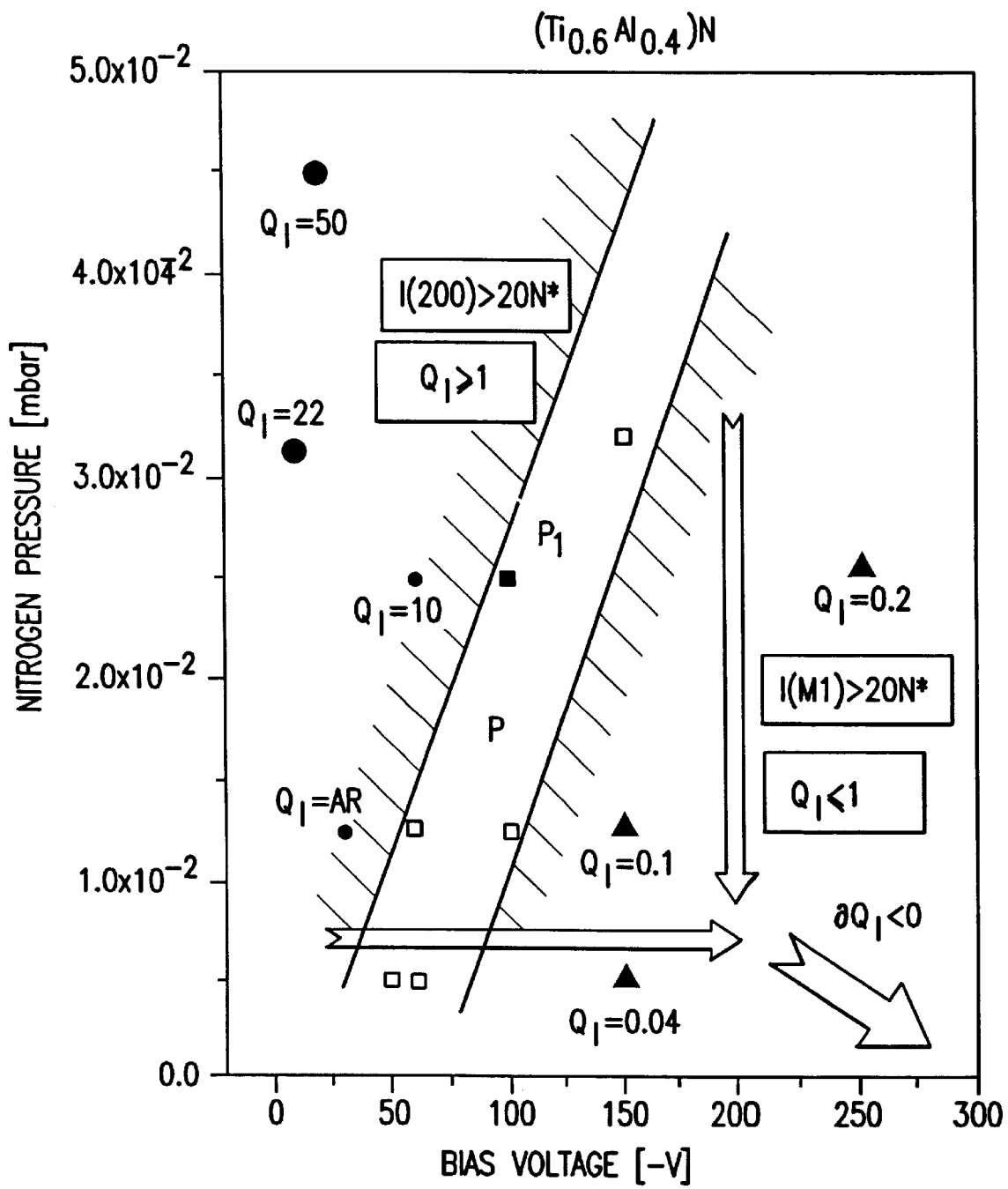
FIG. 1 is a graph of nitrogen pressure versus bias voltage.

An arc ion plating apparatus using magnetically controlled arc sources as described in U.S. Pat. No. 5,709,284 was used operated as shown in table 1 to deposit the MeX layer as also stated in table 1 on solid carbide end mills with a diameter of 10 mm, z=6. The thickness of the MeX layer deposited was always 3 µm. Thereby, in the samples NR. 1 to 5, the inventively stated $Q_I$ values where realised, whereas, for comparison, in the samples number 6 to 10 this condition was not fulfilled. The I(111) value was always significantly larger than 20 times the noise average value, measured according to MS. The coated end mills were used for milling under the conditions stated below to find the milling distance attainable up to attaining an average width of flank wear of 0.20 mm. The resulting milling distance according to the lifetime of such tools is also shown in table 1.

Test Cutting Conditions:

Tool: Solid carbide end mill, dia 10 mm, z=6

Material being cut: AISI D2 (DIN 1.2379)

Cutting Parameters:

$v_c$=20 m/min $f_t$=0.031 mm $a_p$=15 mm $a_e$=1 mm climb milling, dry

It is clearly recognisable from table 1 that the end mills, coated according to the present invention, are significantly more protected against delamination and wear than the end mills coated according to the comparison conditions.

TABLE 1

| | Sample No. | Coating Conditions | | | | | Residual |
|---|---|---|---|---|---|---|---|
| | | Bias Voltage (−V) | $N_2$-pressure (mbar) | Film x = 0.5; Y = 0.5 | $Q_1$ = I (200)/ I (111) | Cutting Distance (m) | Compressive Stress (−GPa) |
| present Invention | 1 | 200 | 3.0 × 10⁻² | $Ti_xAl_y)N$ | 0.1 | 28m (normal wear 0.2 mm) | 5.7 |
| | 2 | 150 | 2.0 × 10⁻² | $(Ti_xAl_y)N$ | 1.0 | 23m (normal wear 0.2 mm) | 4.0 |
| | 3 | 100 | 1.0 × 10⁻² | $(Ti_xAl_y)N$ | 0.9 | 22m (normal wear 0.2 mm) | 4.5 |
| | 4 | 100 | 2.0 × 10⁻² | $(Ti_xAl_y)N$ | 2.0 | 18m (normal wear 0.2 mm) | 2.9 |
| | 5 | 100 | 0.5 × 10⁻² | $(Ti_xAl_y)N$ | 1.0 | 25m (normal wear 0.2 mm) | 4.8 |
| Comparison | 6 | 20 | 3.0 × 10⁻² | $(Ti_xAl_y)N$ | 8.0 | 3m (chipping and delamination) | 1.3 |
| | 7 | 40 | 3.0 × 10⁻² | $(Ti_xAl_y)N$ | 6.1 | 2m (chipping and delamination) | 1.6 |
| | 8 | 40 | 2.0 × 10⁻² | $(Ti_xAl_y)N$ | 4.2 | 4m (chipping and delamination) | 2.0 |
| | 9 | 70 | 3.0 × 10⁻² | $(Ti_xAl_y)N$ | 5.2 | 8m (normal wear 0.2 mm) | 1.8 |
| | 10 | 70 | 2.5 × 10⁻² | $(Ti_xAl_y)N$ | 3.0 | 10m (normal wear 0.2 mm) | 2.3 |

EXAMPLE 2

The apparatus as used for coating according to Example 1 was also used for coating the samples Nr. 11 to 20 of table 2. The tools coated and the test conditions were identical to Example 1. The thickness of the layers is indicated in table 2.

It may be seen that in addition to the coating according to Example 1 there was applied an interlayer of titanium nitride between the MeX layer and the tool body and an outermost layer of the respective material as stated in table 2. The condition with respect to I(111) and average noise level, measured according to MS was largely fulfilled.

It may be noted that provision of the interlayer between the MeX layer and the tool body already resulted in a further improvement. An additional improvement was realised by providing an outermost layer of one of the materials titanium carbonitride, titanium aluminum oxinitride and especially with an outermost layer of aluminum oxide. Again, it may be seen that by realising the inventively stated $Q_I$ values with respect to the comparison samples number 16 to 20, a significant improvement is realised.

The outermost layer of aluminum oxide of 0.3 µm thickness, was formed by plasma CVD.

As stated above, the coated end mills were tested under the same cutting conditions as those of Example 1, $Q_I$ was measured according to MS.

TABLE 2

| Sample No. | | Interlayer ($\mu$m) | TiAl Layer x = 0.5; y = 0.5 | Outermost Layer | I (200)/I (111) | Cutting Distance (m) |
|---|---|---|---|---|---|---|
| Present Invention | 11 | TiN (0.4 $\mu$m) | (Ti$_x$Al$_y$)N (2.6 $\mu$m) | — | 0.5 | 30 m (normal wear 0.2 mm) |
| | 12 | TiN (3.0 $\mu$m) | (Ti$_x$Al$_y$)N (2.3 $\mu$m) | TiCN (0.3 $\mu$m) | 1.2 | 32 m (normal wear 0 2 mm) |
| | 13 | TiN (1.5 $\mu$m) | (Ti$_x$Al$_y$)N (2.55 $\mu$m) | TiCN (0.3 $\mu$m) | 0.5 | 38 m (normal wear 0.2 mm) |
| | 14 | TiN (0.8 $\mu$m) | (Ti$_x$Al$_y$)N (2.4 $\mu$m) | (TiAl)NO (0.3 $\mu$m) | 0.5 | 35 m (normal wear 0.2 mm) |
| | 15 | TiCN (0.3 $\mu$m) | (Ti$_x$Al$_y$)N (2.4 $\mu$m) | Al$_2$O$_3$ (0.3 $\mu$m) | 2.0 | 39 m (normal wear 0.2 mm) |
| Comparison | 16 | TiN (1.0 $\mu$m) | (Ti$_x$Al$_y$)N (2.0 $\mu$m) | — | 3.0 | 12 m (normal wear 0.2 mm) |
| | 17 | TiN (1.5 $\mu$m) | (Ti$_x$Al$_y$)N (2.3 $\mu$m) | TiCN (0.3 $\mu$m) | 5.8 | 0 m (chipping) |
| | 18 | TiN (0.4 $\mu$m) | (Ti$_x$Al$_y$)N (2.3 $\mu$m) | TiCN (0.3 $\mu$m) | 4.5 | 14 m (normal wear 0.2 mm) |
| | 19 | TiN (0.8 $\mu$m) | (Ti$_x$Al$_y$)N (2.4 $\mu$m) | (TiAl)NO (0.3 $\mu$m) | 8.2 | 10 m (normal wear 0.2 mm) |
| | 20 | TiN (0.3 $\mu$m) | (Ti$_x$Al$_y$)N (2.4 $\mu$m) | Al$_2$O$_3$ (0.3 $\mu$m) | 12.3 | 10 m (normal wear 0.2 mm) |

EXAMPLE 3

Again, solid carbide end mills were coated with the apparatus of Example 1 with the MeX layer as stated in table 3, still fulfilling the Q$_f$ conditions as inventively stated and, by far, the condition of I(111) with respect to average noise level, measured according to MS. Thereby, there was introduced one of zirconium, hafnium, yttrium, silicon and chromium, with the amount as stated above, into Me.

The coated end mills were kept in an air oven at 750° C. for 30 min. for oxidation. Thereafter, the resulting thickness of the oxide layer was measured. These results are also shown in table 3. For comparison, inserts coated inventively with different Me compounds of the MeX material were equally tested. It becomes evident that by adding any of the elements according to samples 23 to 32 to Me, the thickness of the resulting oxide film is significantly reduced. The best results with respect to oxidation were realised by adding silicon or yttrium.

It must be pointed out, that it is known to the skilled artisan, that for the MeX material wear resistant layers there is valid: The better the oxidation resistance and thus the thinner the resulting oxide film, the better the cutting performance.

EXAMPLE 4

Again, the apparatus and coating method according to Example 1 was used. Solid carbide end mills with a diameter of 10 mm with 6 teeth were coated with a 3.0 $\mu$m MeX layer. There was provided a titanium nitride interlayer with a thickness of 0.08 $\mu$m between the MeX and the tool body. Test conditions for the end mills were:

Tool:
    Solid carbide end mill, dia. 10 mm
    z=6
Material:
    AISI D2 (DIN 1.2379)
    60 HRC
Cutting parameters:
    $v_c$=20 m/min
    $f_t$=0.031 mm
    $a_p$=15 mm
    $a_e$=1 mm
    Climb milling, dry The solid carbide end mills were used until an average width of flank wear of 0.20 mm was obtained. The result is shown in table 4. Again the I(111) to noise condition, measured with MS, was clearly fulfilled for sample No. 35, for sample No. 34 the I(200) to noise condition was fulfilled.

TABLE 3

| | Sample No. | Layer Composition | w | x | y | z | Thickness of Oxide Film ($\mu$m) |
|---|---|---|---|---|---|---|---|
| Present Invention | 21 | (Ti$_x$Al$_y$Y$_z$)N | | 0.48 | 0.5 | 0.02 | 0.7 |
| | 22 | (Ti$_x$Al$_y$Cr$_z$)N | | 0.49 | 0.5 | 0.02 | 0.9 |
| | 23 | (Ti$_x$Al$_y$Zr$_z$)N | | 0.49 | 0.5 | 0.02 | 0.7 |
| | 24 | (Ti$_x$Al$_y$Y$_z$)N | | 0.25 | 0.5 | 0.25 | 0.1 |
| | 25 | (Ti$_x$Al$_y$Zr$_z$)N | | 0.25 | 0.5 | 0.25 | 0.5 |
| | 26 | (Ti$_x$Al$_y$w$_z$)N | | 0.4 | 0.5 | 0.1 | 0.8 |
| | 27 | (Ti$_x$Al$_y$Si$_z$)N | | 0.4 | 0.5 | 0.1 | 0.1 |
| | 28 | (Ti$_x$Al$_y$Si$_z$)N | | 0.48 | 0.5 | 0.02 | 0.2 |
| | 29 | (Ti$_x$Al$_y$Hf$_z$)N | | 0.4 | 0.5 | 0.1 | 0.9 |
| | 30 | (Ti$_x$Al$_y$Y$_3$Si$_{wz}$)N | 0.1 | 0.3 | 0.5 | 0.1 | 0.05 |
| Comparison | 31 | (Ti$_x$Al$_y$)N | | 0.4 | 0.6 | | 1.8 |
| | 32 | (Ti$_x$Al$_y$Nb$_z$)N | | 0.4 | 0.5 | 0.1 | 2.5 |
| | 33 | (Ti$_x$Al$_y$Ta$_z$)N | | 0.4 | 0.5 | 0.1 | 3.3 |

TABLE 4

| | Bias Voltage (−V) | N$_2$ Pressure (mbar) | Arc current (A) | inter-layer | layer | x | y | Q$_1$ | Residual Stress (GPa) | Cutting distance (m) |
|---|---|---|---|---|---|---|---|---|---|---|
| Comparison | 34 | 40 | 3.0 × 10$^{-2}$ | 200 | TiN 0.08 μm | (Ti$_x$Al$_y$)N | 0.6 | 0.4 | 5.0 | 2.2 | 17 m |
| Present Invention | 35 | 150 | 1.0 × 10$^{-2}$ | 200 | TiN 0.08 μm | (Ti$_x$Al$_y$)N | 0.6 | 0.4 | 0.05 | 4.7 | 12 m |

EXAMPLE 5

The apparatus and coating method according to Example 1 was used.

Solid carbide ball nose mills were coated with 3.1 μm MeX and a TiN interlayer with the thickness 0.07 μm. The coated tools were tested with milling a hardened mold steel.

Test Conditions:

Tool:
  Solid carbide ball nose mill J97 (Jabro), R4(Ø8×65 mm)

Material:
  Mold steel H 11 (DIN 1.2343), HRC 49.5

Cutting parameters:
  v$_c$=220 m/min
  a$_p$=0.5 mm
  no coolant

The tool life was evaluated in minutes.

TABLE 5

| | Bias Voltage (−V) | N$_2$ Pressure (mbar) | Arc current (A) | inter-layer | layer | x | y | Q$_1$ | Residual Stress (GPa) | Tool life (m) |
|---|---|---|---|---|---|---|---|---|---|---|
| Comparison | 1 | 150 | 1.0 × 10$^{-2}$ | 200 | TiN 0.07 μm | (Ti$_x$Al$_y$)N | 0.6 | 0.4 | 0.04 | 5.1 | 198 m |
| Present Invention | 2 | 40 | 3.0 × 10$^{-2}$ | 200 | TiN 0.07 μm | (Ti$_x$Al$_y$)N | 0.6 | 0.4 | 5.7 | 1.8 | 127 min |

In FIG. 1 there is shown, with linear scaling a diagram of nitrogen partial pressure versus bias voltage of the tool body as applied for reactive cathodic arc evaporation as the reactive PVD deposition method used to realise the Examples which were discussed above.

All the process parameters of the cathodic arc evaporation process, namely arc current;

process temperature deposition rate evaporated material strength and configuration of magnetic field adjacent the arc source geometry and dimensions of the process chamber and of the workpiece tool to be treated were kept constant. The remaining process parameters, namely partial pressure of the reactive gas—or total pressure—and bias voltage of the tool body to be coated as a workpiece and with respect to a predetermined electrical reference potential, as to the ground potential of the chamber wall, were varied.

Thereby, titanium aluminum nitride was deposited. With respect to reactive gas partial pressure and bias voltage of the tool body, different working points were established and the resulting Q$_I$ values at the deposited hard material layers were measured according to MS.

It turned out that there exists in the diagram according to FIG. 1 an area P, which extends in a first approximation linearly from at least adjacent the origin of the diagram coordinates, wherein the resulting layer leads to very low XRD intensity values of I(200) and I(111). It is clear that for exactly determining the limits of P, a high number of measurements will have to be done. Therein, none of the I(200) and I(111) intensity values is as large as 20 times the average noise level, measured according to MS.

On one side of this area P and as shown in FIG. 1 Q$_I$ is large than 1, in the other area with respect to P, Q$_I$ is lower than 1. In both these areas at least one of the values I(200), I(111) is larger than 20 times the average noise level, measured according to MS.

As shown with the arrows in FIG. 1, diminishing of the partial pressure of the reactive gas—or of the total pressure if it is practically equal to the said partial pressure—and/or increasing of the bias voltage of the tool body being coated, leads to reduction of Q$_I$. Thus, the inventive method for producing a tool which comprises a tool body and a wear resistant layer system, which latter comprises at least one hard material layer, comprises the steps of reactive PVD depositing the at least one hard material layer in a vacuum chamber, thereby preselecting process parameter values for the PVD deposition process step beside of either or both of the two process parameters, namely of partial pressure of the reactive gas and of bias voltage of the tool body. It is one of these two parameters or both which are then adjusted for realising the desired Q$_I$ values, thus, and according to the present invention, bias voltage is increased and/or partial reactive gas pressure is reduced to get Q$_I$ values, which are, as explained above, at most 2, preferably at most 1 or even at most 0.5 or even at most 0.2. Most preferred is Q$_I$≦0.1. Beside the inventively exploited Q$_I$ value, in this "right hand" area, with respect to P, I(111) is larger, mostly much larger than 20 times the average noise level of intensity, measured according to MS.

Figure 2:
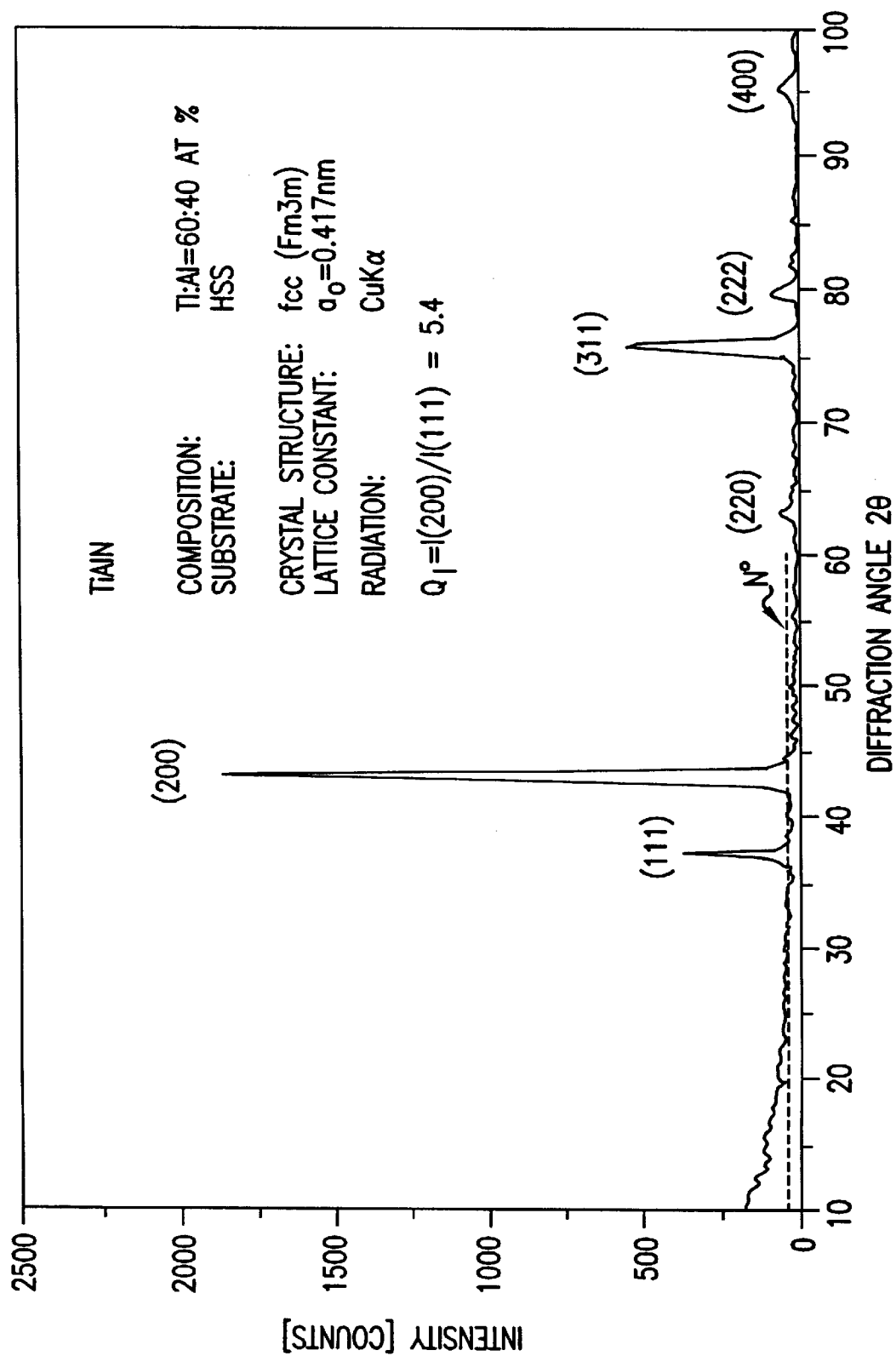
FIG. 2 is a graph of intensity versus diffraction angle.

In FIG. 2 a typical intensity versus angle 2θ diagram is shown for the titanium aluminum nitride hard material layer deposited in the Q$_I$≧1 region of FIG. 1, resulting in a Q$_I$ value of 5.4. The average noise level N* is much less than I(200)/20. Measurement is done according to MS.

Figure 3:
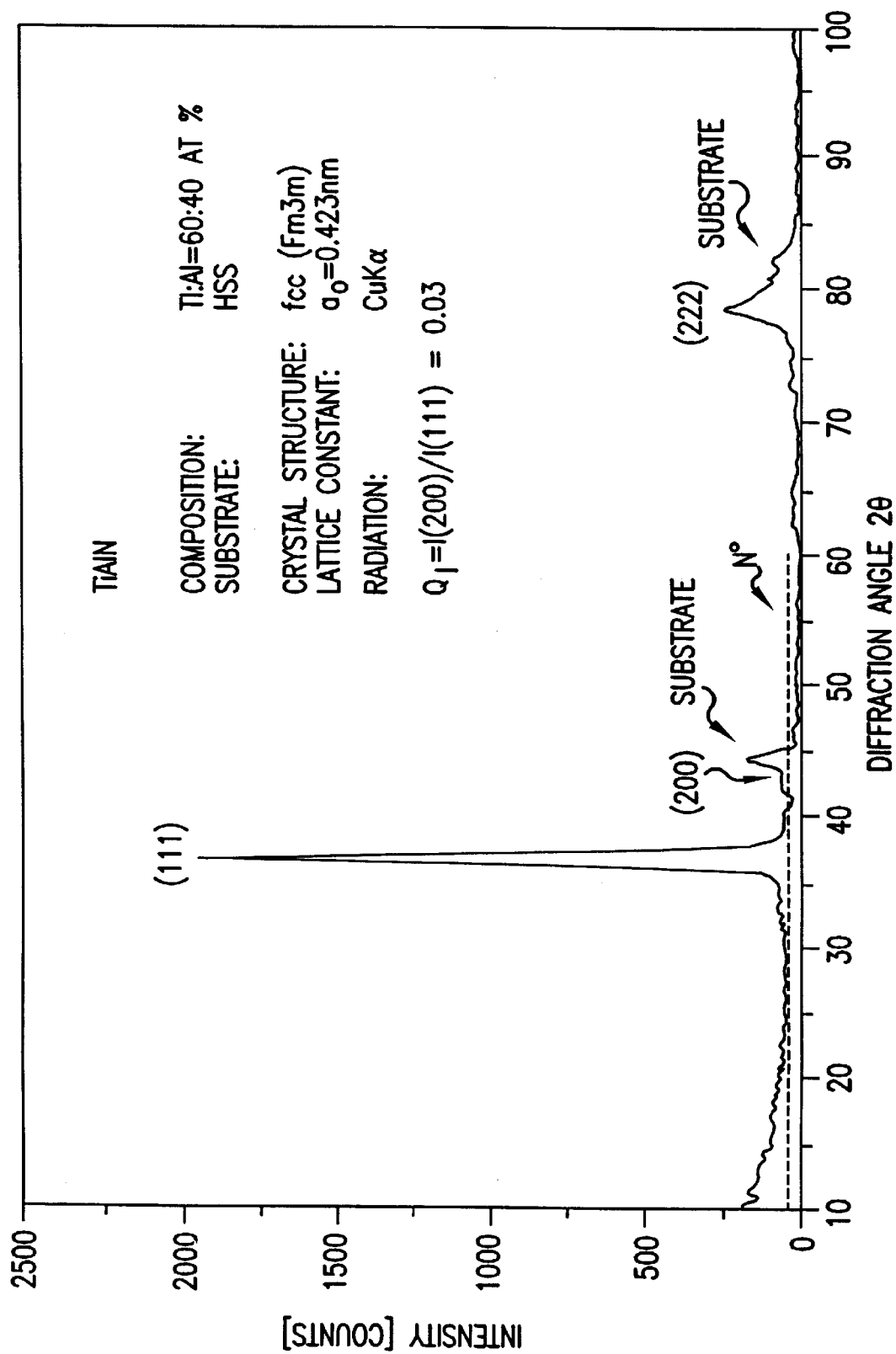
FIG. 3 is a graph similar to FIG. 2 but with deposition being controlled by bias voltage and nitrogen partial pressure to result in $Q_I \leq$.

In FIG. 3 a diagram in analogy of that in FIG. 2 is shown, but the titanium aluminum nitride deposition being controlled by bias voltage and nitrogen partial pressure to inventively result in a $Q_I \leq 1$. The resulting $Q_I$ value is 0.03. Here again the I(111) value is larger than 20 times the average noise level of intensity, both measured according to MS.

Please note that in FIG. 1 the respective $Q_I$ values in the respective regions are noted at each working point measured (according to MS).

Figure 4:
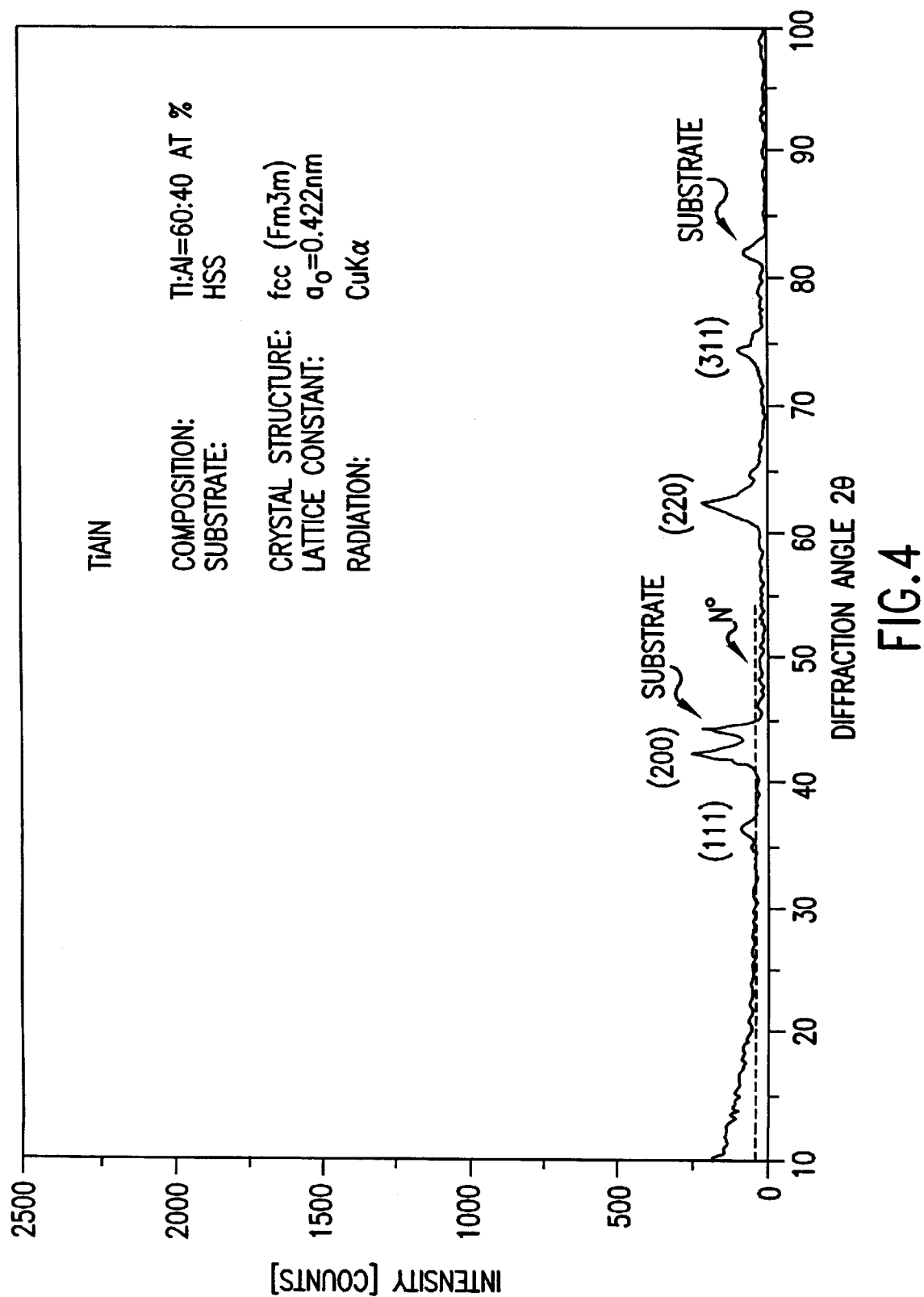
FIG. 4 is a graph similar to FIGS. 2 and 3 shown for working point $P_1$ in FIG. 1.

In FIG. 4 a diagram in analogy to that of the FIGS. 2 and 3 is shown for working point $P_1$ of FIG. 1. It may be seen that the intensities I(200) and I(111) are significantly reduced compared with those in the area outside P. None of the values I(200) and I(111) reaches the value of 20 times the noise average level N*.

Thus, by simply adjusting at least one of the two $Q_I$-controlling reactive PVD process parameters, namely of reactive gas partial pressure and of workpiece bias voltage, the inventively exploited $Q_I$ value is controlled.

In FIG. 1 there is generically shown with $\theta Q_I < 0$ the adjusting direction for lowering $Q_I$, and it is obvious that in opposite direction of adjusting the two controlling process parameters, and increase of $Q_I$ is reached.

What is claimed is:

1. A tool with a tool body and a wear resistant layer system, said layer system comprising at least one layer of MeX, wherein Me comprises titanium and aluminum;

X is at least one of nitrogen and of carbon and wherein said layer has a $Q_I$ value $$Q_I \leq 2,$$

whereby I(111) is at least 20 times an intensity average noise value measured according to MS, and said tool is one of a solid carbide end mill;

a solid carbide nose mill;

a cemented carbide gear cutting tool.

2. The tool of claim 1, wherein
   $Q_I \leq 1$.

3. The tool of claim 1, wherein said MeX material is one of titanium aluminum nitride, titanium aluminum carbonitride, and of both titanium aluminum nitride and titanium aluminum carbonitride.

4. The tool of claim 1, where Me further comprises at least one further element out of the group consisting of boron, zirconium, hafnium, yttrium, silicon, tungsten, chromium.

5. The tool of claim 4, wherein said further element is contained in Me with a content i in which $$0.05 \text{ at. \%} \leq i \leq 60 \text{ at. \%},$$

taken the content of Ti as 100 at. %.

6. The tool of claim 1, further comprising a further layer of titanium nitride between said at least one layer and said tool body and wherein said further layer has a thickness d in which $$0.05 \text{ }\mu\text{m} \leq d \leq 5.0 \text{ }\mu\text{m}.$$

7. The tool of claim 6, wherein said layer system consists of said at least one layer and said further layer.

8. The tool of claim 1, wherein the stress, σ, within said at least one layer is $$2 \text{ Gpa} \leq \sigma \leq 8 \text{ Gpa}.$$

9. The tool of claim 1, wherein the content, x, of titanium is $$70 \text{ at. \%} \geq x \geq 40 \text{ at. \%}.$$

10. The tool of claim 1, wherein the content, y, of aluminum is $$30 \text{ at. \%} \leq y \leq 60 \text{ at. \%}.$$

11. The tool of claim 9, wherein the content, y, of aluminum is $$30 \text{ at. \%} \leq y \leq 60 \text{ at. \%}.$$

12. The tool of claim 1, wherein $Q_I \leq 0.5$.
13. The tool of claim 1, wherein $Q_I \leq 0.2$.
14. The tool of claim 1, wherein $Q_I \leq 0.1$.
15. The tool of claim 1, wherein the stress, σ, within said at least one layer is $$4 \text{ Gpa} \leq \sigma \leq 6 \text{ Gpa}.$$

16. The tool of claim 1, wherein the content, x, of titanium is $$65 \text{ at. \%} \geq x \geq 55 \text{ at. \%}.$$

17. The tool of claim 1, wherein the content, y, of aluminum is $$35 \text{ at. \%} \leq y \leq 45 \text{ at. \%}.$$

18. The tool of claim 9, wherein the content, y, of aluminum is $$35 \text{ at. \%} \leq y \leq 45 \text{ at. \%}.$$

* * * * *